United States Patent
Cai et al.

(10) Patent No.: US 8,995,165 B2
(45) Date of Patent: Mar. 31, 2015

(54) RESISTIVE MEMORY CELL

(75) Inventors: Yimao Cai, Beijing (CN); Zhenni Wan, Beijing (CN); Ru Huang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/522,858

(22) PCT Filed: Feb. 22, 2012

(86) PCT No.: PCT/CN2012/071436
§ 371 (c)(1),
(2), (4) Date: May 30, 2013

(87) PCT Pub. No.: WO2013/075416
PCT Pub. Date: May 30, 2013

(65) Prior Publication Data
US 2014/0268988 A1     Sep. 18, 2014

(30) Foreign Application Priority Data
Nov. 25, 2011  (CN) .......................... 2011 1 0382225

(51) Int. Cl.
  *G11C 11/00*  (2006.01)
  *H01L 45/00*  (2006.01)
  *H01L 27/24*  (2006.01)
  *G11C 13/00*  (2006.01)

(52) U.S. Cl.
  CPC ............. *H01L 45/12* (2013.01); *H01L 45/04* (2013.01); *H01L 45/1233* (2013.01); *H01L 45/146* (2013.01); *H01L 27/2436* (2013.01); *G11C 13/0002* (2013.01)
  USPC ............ 365/148; 365/158; 365/163; 365/174

(58) Field of Classification Search
  USPC .................................. 365/148, 158, 163, 174
  See application file for complete search history.

(56) References Cited

U.S. PATENT DOCUMENTS

| 5,770,881 A | 6/1998 | Pelella |
| 7,463,506 B2 | 12/2008 | Muraoka |
| 7,714,311 B2 | 5/2010 | Muraoka |

(Continued)

FOREIGN PATENT DOCUMENTS

| CN | 1898749 | 1/2007 |
| CN | 101221953 | 7/2008 |
| CN | 101764143 | 6/2010 |

OTHER PUBLICATIONS

English Language Abstract for CN 101221953 published Jul. 16, 2008.

(Continued)

*Primary Examiner* — Fernando Hidalgo
(74) *Attorney, Agent, or Firm* — DLA Piper LLP (US)

(57) ABSTRACT

The present invention discloses a resistive memory cell, including a unipolar type RRAM and a MOS transistor as a selection transistor serially connected to the unipolar type RRAM, wherein the MOS transistor is fabricated over a partial depletion SOI substrate and provides a large current for program and erase of the RRAM by using an intrinsic floating effect of the SOI substrate. The present invention utilizes a floating effect of a SOI device, in which under the same width/length ratio, a MOS transistor over a SOI substrate can provide larger source/drain current than a MOS transistor over a bulk silicon, so that the area occupied by the selection transistor is reduced, which is advantageous to the integration of the RRAM array.

18 Claims, 3 Drawing Sheets

(56) References Cited

U.S. PATENT DOCUMENTS

| | | |
|---|---|---|
| 8,159,871 B2 | 4/2012 | Chung |
| 8,502,185 B2 * | 8/2013 | Lu et al. ............................. 257/4 |
| 2002/0190323 A1 * | 12/2002 | Aoki ............................. 257/351 |
| 2004/0156233 A1 | 8/2004 | Bhattacharyya |
| 2007/0159867 A1 | 7/2007 | Muraoka |
| 2008/0185567 A1 * | 8/2008 | Kumar et al. ..................... 257/2 |
| 2010/0157664 A1 | 6/2010 | Chung |
| 2010/0182821 A1 | 7/2010 | Muraoka |
| 2011/0042639 A1 * | 2/2011 | Schricker et al. ................. 257/2 |
| 2011/0156055 A1 * | 6/2011 | Mazellier ....................... 257/77 |

OTHER PUBLICATIONS

English Language Abstract of CN 101764143 published Jun. 30, 2010.

International Search Report issued in PCT/CN2012/071436 on Aug. 30, 2012.

English Language Abstract of CN 1898749 published Jan. 17, 2007.

* cited by examiner

RESISTIVE MEMORY CELL

CROSS-REFERENCES TO RELATED APPLICATION

The present application claims priority to Chinese application number No. 201110382225.4, filed with the State Intellectual Property Office of China on Nov. 25, 2011, which is incorporated herein by reference.

FIELD OF THE INVENTION

The present invention belongs to the field of nonvolatile memory technology in fabrication of ultra large scaled integrated circuit, and particularly relates to a resistive nonvolatile memory unit and operation mechanism thereof.

BACKGROUND OF THE INVENTION

A semiconductor memory is an indispensable component of various electronic device systems, and a nonvolatile semiconductor memory has a characteristic of retaining data even if its power is off, thus it is widely used in various mobile, portable apparatuses, such as cell phone, laptop, palmtop, or the like. With an increasing shrinkage of feature size, a conventional floating gate structure is gradually approaching the bottleneck, however, emerge of a new type of resistive random access memory (RRAM) brings hopes for fabricating a smaller, rapider, more economic nonvolatile memory. The RRAM has vantages of easy fabricating process, rapid read/write speed, high storage density, nonvolatility and excellently compatibility with a conventional silicon integrated circuit process, and thus has huge potential in application.

A RRAM is a nonvolatile memory based on electrically induced resistive change effect of some materials. The RRAM has a simple Metal-Insulator-Metal (MIM) capacitor structure as a functional device, in which an insulating layer material has a characteristic of electrically induced resistive change and has a resistive which may be reversibly changed under a specific external electrical signal. A process in which a resistive of the RRAM transits from a high resistive state (OFF-state) to a low resistive state (ON-state) is referred as a program (set) operation; a process in which the resistive of the RRAM transits from a low resistive state to a high resistive state is referred as an erase (reset) operation. The RRAM is mainly classified into unipolar type and bipolar type, depending on whether the voltage polarities occurred in Set/Reset processes are identical or not. The unipolar type RRAM has identical polarities in the Set/Reset process, while the bipolar type RRAM has different polarities in the Set/Reset process.

One transistor one RRAM (1T1R) is a currently typical RRAM structure, i.e. one RRAM and a drain terminal of one transistor (MOSFET) as a switch are serially connected. The transistor is referred as a selection transistor. The selection transistor in conventional 1T1R is formed on a bulk silicon substrate, and a RRAM in the conventional 1T1R is formed over the selection transistor with a thick oxide isolation layer therebetween. Since Set/Reset currents required in a RRAM for programming is relatively large, it is necessary to design the selection transistor MOSFET with a large width/length ratio in order to provide a sufficiently large saturation area current, which is adverse to the integration of memory with high density.

SUMMARY OF THE INVENTION

An object of an embodiment of the present invention is to provide a resistive memory cell capable of reducing the area of a selection transistor so that integration degree of a memory array is increased.

The object is achieved by a technical solution as follow.

A resistive memory cell includes a unipolar type RRAM and a MOS transistor used as a switch connected in series with the unipolar type RRAM, wherein the MOS transistor is formed over a partial depletion Silicon-On-Insulator (SOI) substrate.

Furthermore, a silicon film on an insulator layer of the SOI substrate preferably has a thickness of 200 nm~500 nm.

The insulator of the SOI substrate has a thickness of 800 nm~1 μm. The insulator layer is typically formed of silicon oxide.

In a typical structure of the resistive memory cell of the embodiment of the present invention, the MOS transistor is formed over the partial depletion SOI substrate; the MOS transistor includes a source terminal, a drain terminal, a gate dielectric layer and a gate terminal; the unipolar type RRAM includes a top metal layer, a bottom metal layer and a resistive material layer interposed between the top metal layer and the bottom metal layer; and the RRAM is located over the MOS transistor, with an isolation layer interposed between the RRAM and the MOS transistor, and in the isolation layer a metal via hole is formed to electrically connect the drain terminal of the MOS transistor and the bottom metal layer of the RRAM.

Generally, the isolation layer interposed between the MOS transistor and the RRAM is a silicon oxide layer. The resistive material layer of the RRAM may be but not limited to materials such as nickel oxide, zirconium oxide, silicon oxide doped with copper or the like. The top and bottom metal layer may be formed of inert metal such as platinum, gold, copper or the like.

The embodiment of the present invention mainly utilizes a floating body effect of the MOS transistor formed over the SOI substrate, wherein the MOS transistor is used as a selection transistor and may provide a larger program current to the RRAM in a case of a smaller size. The floating body effect is also referred as Kink effect which mainly occurs in a partial depletion SOI device (while an entire depletion SOI device does not have this effect), and characterizes in that a current in the MOSFET saturation region abruptly increases (see, KOICHI KATO, TETSUNORI WADA, ANDKENJI TANIGUCHI, Analysis of Kink Characteristics in Silicon-on-Insulator MOSFET'S Using Two-Carrier Modeling, IEEE JOURNAL OF SOLID-STATE-CIRCUITS, VOL. SC-20, NO. 1, FEBRUARY 1985). A physical mechanism of the effect is that a high voltage of a drain terminal causes an aggravation of impact ionization and thus a large number of electron-hole pairs are generated, wherein the electrons are collected by the electrical field at the drain terminal and the holes move to a neutral body region with a low electrical potential, which result in that a potential of a body region is increased and a source-body junction is positively biased, so that a threshold voltage is reduced and a drain current is increased.

In a conventional 1T1R unit, the selection transistor is formed over the bulk silicon substrate, however, in an embodiment of the present invention, the 1T1R unit is formed over the SOI substrate, so that a high bias voltage (3V~5V) enough to induce a floating body effect to the drain terminal of the MOS transistor in the Set/Reset phase can be provided to the RRAM while the selection transistor remaining a small size, and a relatively large current is also applied. According to a reference report, as for a MOS transistor over a SOI substrate, under a gate voltage of 3V, after a floating body effect is induced by applying a source/drain voltage of 3V, a source/drain current is increased by 30% (see, KOICHI KATO, TETSUNORI WADA, ANDKENJI TANIGUCHI, Analysis of Kink Characteristics in Silicon-on-Insulator MOSFET'S Using Two-Carrier Modeling, IEEE JOURNAL OF SOLID-STATE CIRCUITS, VOL. SC-20, NO. 1, FEBRUARY 1985, in particular, FIG. 2 shows a $I_d$-$V_d$ graph of the MOS transistor formed over the SOI substrate having a floating effect). This means that, if the same current is provided, width/length ratio of the selection transistor over the SOI substrate may be reduced to 77% of that of the selection transistor over the bulk silicon substrate. If the length of the gate is assumed unchanged under the same process condition, this means that the area of memory cell is reduced to 77% of original case. It can be seen that the integration degree can be significantly improved.

When the resistive memory cell of the embodiment of the present invention is applied, the source terminal of the MOS transistor is grounded and the gate is connected to a word line; the metal layer at one end of the unipolar type RRAM is electrically connected to the drain terminal of the MOS transistor, and the metal layer at the other end is connected to a bit line. A program process and an erase process are as follow.

In the program (Set) phase, the source terminal of the MOS transistor is grounded, the word line connected to the gate of the MOS transistor is selected, and the MOS transistor is turned on after being applied with a high level of voltage (1V~2V); the bit line at the other terminal of the RRAM is also selected, and is applied with a high level of voltage of 5V~7V. At this time, the RRAM is in a high resistive state, a voltage between the source terminal and the bit line of the MOS transistor mainly falls on the RRAM, the RRAM is turned on, the resistive is reduced, and a voltage between the source and the drain is gradually increased. When the voltage between the source and the drain has reached a certain level (3V~5V), an intrinsic floating body effect of SOI occurs, a source/drain current is abruptly increased so as to provide a big current suitable for the program of the RRAM.

In the erase (Reset) phase, the source terminal of the MOS transistor is grounded, and after the word line is selected (being applied with a high level of voltage of 2V~3V) the bit line is applied with a high level of voltage of 4V~6V. Since at this time the RRAM is in a low resistive state, the source/drain of the MOS transistor take most part of the voltage, so that a floating body effect occurs and a large current is provided for the erase of the RRAM.

As compared with the conventional art, the resistive memory cell provided by embodiments of the present invention has the following advantage. A MOS selection transistor is formed over the SOI substrate, a large current is provided for the program and erase of the RRAM by using an intrinsic floating effect of the RRAM. In the conventional 1T1R technology, usually a very large width/length ratio is needed for driving a RRAM program in a MOS transistor due to the very low drive ability of MOS transistor, so that the advantage of high integration degree of the RRAM is limited. In embodiments of the present invention, the floating body effect of the SOI device is used. Under the same aspect ratio, the MOS transistor over the SOI substrate can provide larger source/drain current than the MOS transistor over a bulk silicon, and the area occupied by the selection transistor is reduced and the integration degree of the RRAM can be effectively increased.

BRIEF DESCRIPTION OF THE DRAWINGS

FIG. 1 is a schematic diagram of a structure of a 1T1R memory cell formed over a partial depletion SOI substrate according to an embodiment of the present invention, in which:

Figure 1:
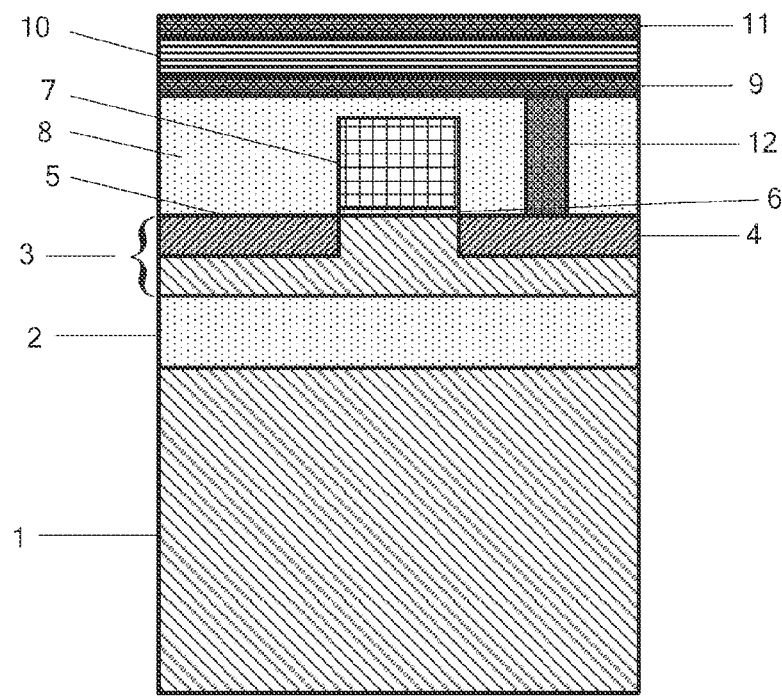

reference sign 1 denotes a silicon substrate, reference sign 2 denotes a silicon oxide layer, reference sign 3 denotes a silicon film, reference sign 4 denotes a drain terminal of a selection transistor (connected to a metal via hole), reference sign 5 denotes a source terminal of the selection transistor (grounded), reference sign 6 denotes a gate oxide layer, reference sign 7 denotes a polysilicon gate (connected to a word line), reference sign 8 denotes an oxide isolation layer, reference signs 9 and 11 denote metal layers at both ends of an unipolar type RRAM, reference sign 10 denotes a resistive oxide layer of the unipolar type RRAM, and reference sign 12 denotes a metal via.

Figure 2:
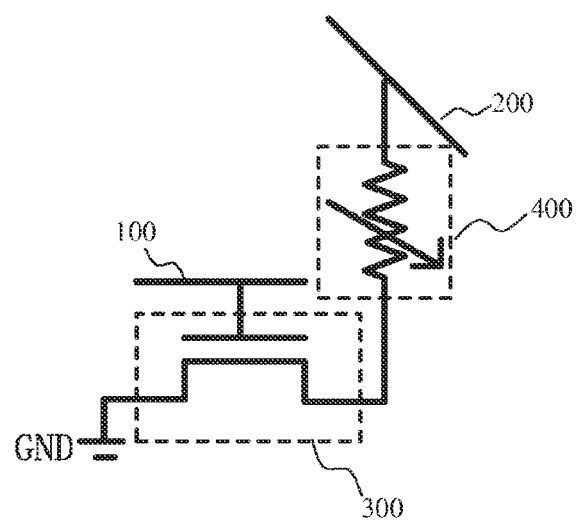

FIG. 2 is a schematic diagram of a 1T1R unit circuit according to an embodiment of the present invention, in which:

reference sign 100 denotes a word line, reference sign 200 denotes a bit line, reference sign 300 denotes a MOS selection transistor formed over a SOI substrate, and reference sign 400 denotes an unipolar type RRAM.

Figure 3:
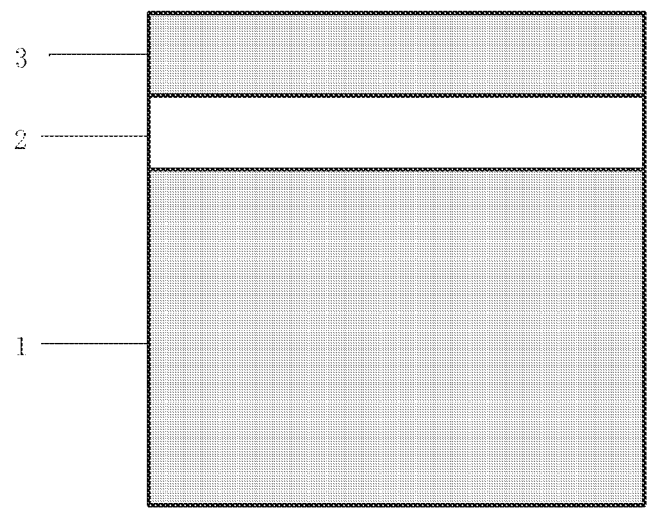
Figure 3:
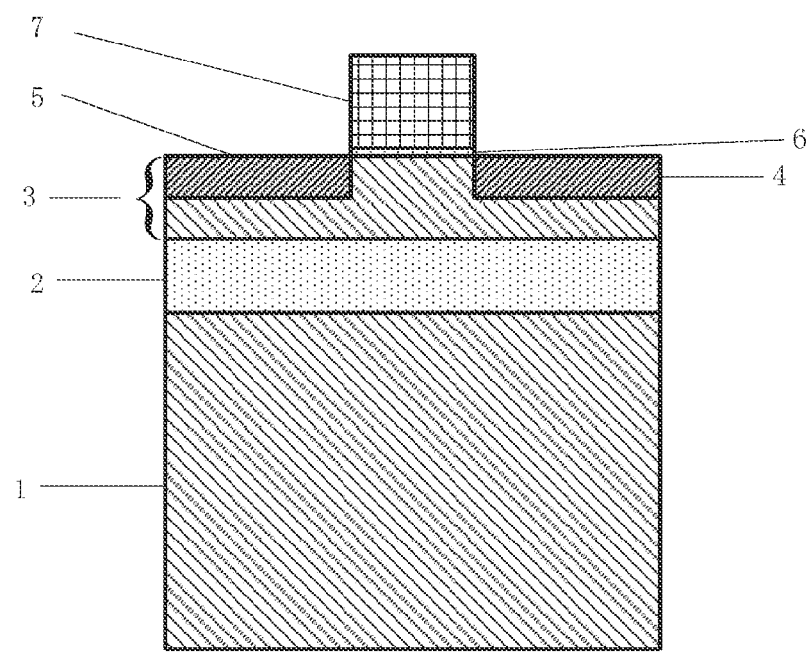
Figure 3:
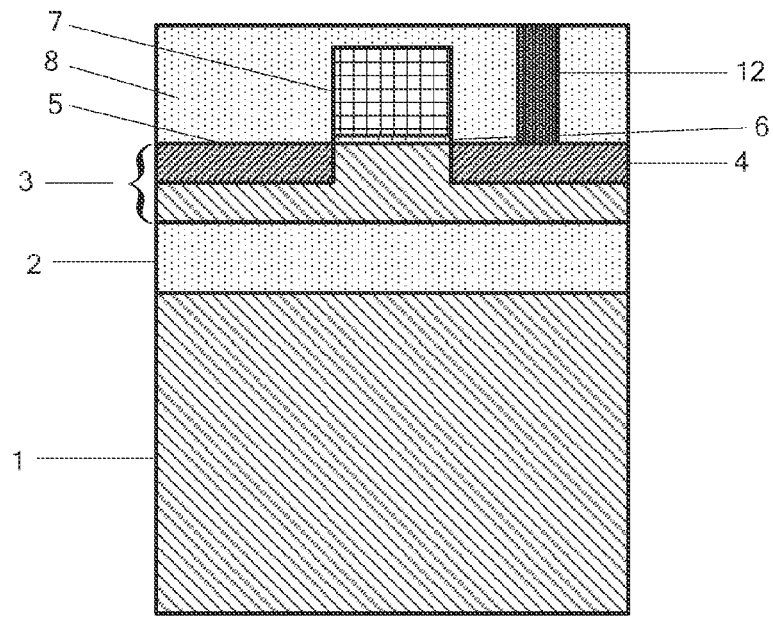
Figure 3:
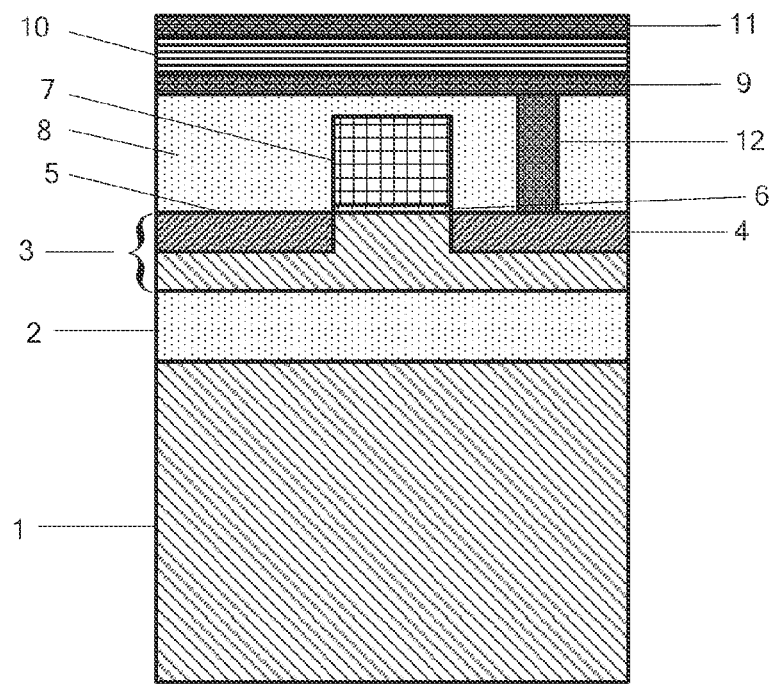

FIG. 3(a)-FIG. 3(d) are schematic diagrams illustrating a fabrication process of a 1T1R memory cell according to an embodiment of the present invention, in which: FIG. 3(a) is a schematic diagram of a SOI substrate; FIG. 3(b) is a schematic diagram of a N-type MOSFET transistor as a selection transistor formed over the SOI substrate; FIG. 3(c) is a schematic diagram showing that a thick oxide layer used for isolation is deposited over the selection transistor and a metal via hole is opened on the drain terminal; and FIG. 3(d) is a schematic diagram showing that a RRAM is formed on the thick oxide layer.

DETAILED DESCRIPTION OF THE EMBODIMENTS

In order to easily understand the above objects, features, and advantages of embodiments of the present invention, the specific embodiments of the present invention will now be described in detail in combination with drawings.

As shown in FIG. 1, in an embodiment of the present invention, a resistive memory cell is fabricated over a SOI substrate, the structure of the resistive memory cell includes a MOS selection transistor fabricated over the SOI substrate and a unipolar type RRAM fabricated above the selection transistor with a thick oxide isolation layer 8 interposed therebetween. In this structure, the SOI substrate includes a silicon substrate 1, a silicon oxide layer 2 and a silicon film 3; the MOS selection transistor includes a drain terminal 4 (connected to a metal via hole), a source terminal 5 (grounded), a gate oxide layer 6 and a polysilicon gate 7 (connected to a word line); the unipolar type RRAM includes a metal layer 9 and a metal layer 11 at both ends of the unipolar RRAM and includes a resistive oxide layer 10 between the metal layers 9 and 11, wherein the metal layer 9 is connected to the drain terminal 4 of the MOS selection transistor through a metal via hole 12. Thus, a 1T1R unit is formed. FIG. 2 shows the circuit structure of the 1T1R unit, in which reference sign 100 shows a word line (connected to a gate of the MOS selection transistor), reference sign 200 shows a bit line (connected to an upper metal layer of the RRAM), and a dotted frame 300 shows a MOS selection transistor fabricated over the SOI substrate, a dotted frame 400 denotes the unipolar type RRAM.

A process of fabricating the 1T1R unit over the SOI substrate is described as follow.

(1) A suitable SOI substrate is selected, as shown in FIG. 3(a), the SOI substrate includes a silicon substrate 1, a silicon oxide layer 2 and a silicon film 3; and in order to ensure that the device can be partially depleted, the silicon film 3 has a thickness of about 300 nm and the silicon oxide layer 2 has a thickness of about 800 nm.

(2) An N type MOSFET as selection transistor is fabricated over the SOI substrate, as shown in FIG. 3(b). The MOSFET includes a drain terminal 4, a source terminal 5, a gate oxide layer 6 and a polysilicon gate 7.

(3) A thick oxide layer 8 used for isolation is deposited over the selection transistor, and a metal via hole 12 is formed to be connected with the drain terminal 4 so that the selection transistor and the RRAM are serially connected, as shown in FIG. 3(c).

(4) A unipolar type RRAM memory is formed over the oxide layer 8, and the RRAM memory includes a metal layer 9 and a metal layer 11 and a resistive oxide layer 10 interposed therebetween, as shown in FIG. 3(d). The material used may be but not be limited to the following: the resistive oxide layer 10 is formed of nickel oxide, and the metal layers 9 and 11 at both ends of the memory may be formed of platinum.

The MOS selection transistor of the resistive memory cell is not fabricated over a conventional bulk silicon substrate, but over a SOI substrate. As aforementioned, if the MOS selection transistor in the 1T1R structure is fabricated over the SOI substrate, a source/drain current of the selection transistor may be effectively increased under a certain width/length ratio, and hence the integration degree of the resistive nonvolatile memory device is improved, thereby the storage density of the memory device is increased and the performance of the memory device is improved.

The circuit connection of the above resistive 1T1R memory cell is as shown in FIG. 2. In a program/erase process of the RRAM memory, a drain terminal voltage applied to a bit line 200 is sufficiently high so that a floating body effect of the MOS selection transistor over the SOI substrate can be induced, thus a saturation current is significantly increased to provide a sufficiently large current for the program/erase of the RRAM, thereby the area occupied by the selection transistor is effectively reduced, which is advantageous to the integration of the RRAM array.

Hereafter, a program method for the RRAM 400 in FIG. 2 is described in detail with reference to FIG. 2.

(1) A word line 100 of the MOS selection transistor 300 connected serially to the RRAM 400 is applied with a high voltage level of 1.5V, while the source terminal is grounded.

(2) The bit line 200 is applied with a voltage of 5~7V so as to induce the floating body effect of the MOS selection transistor.

(3) The RRAM 400 reached a Set voltage so that the RRAM 400 is programmed.

The erase method is described as follow.

(1) The word line 100 is maintained at a high voltage level of 2.5V, and the source terminal is grounded.

(2) The bit line is applied with a voltage of 3~5V so as to induce the floating body effect of the MOS selection transistor.

(3) The RRAM 400 reaches a Reset voltage so that the RRAM 400 is programmed.

The above described embodiments is only some of preferable embodiments of the present invention, and do not limit the present invention by any way. Any one skilled in the art can understand that various changes and modifications or equivalent embodiments can be made to technical solutions of the present invention by using the method and technical content disclosed above without departing from the spirit or scope of the technical solutions of the present invention. Therefore, any content without departing from the technical solutions of the present invention, any simple modification, and equivalent changes and modifications all fall into the scope to be protected by the technical solutions of the present invention.

What is claimed is:

1. A program and erase method of a resistive memory cell comprising a unipolar type RRAM and a MOS transistor serially connected with the RRAM as a switch and the MOS transistor is fabricated over a partial depletion SOI substrate, comprising:
   grounding a source terminal of the MOS transistor and connecting a gate of the MOS transistor to a word line;
   electrically connecting a metal layer at one end of the unipolar type RRAM to a drain terminal of the MOS transistor, and
   connecting a metal layer at the other end to a bit line;
   when performing a program operation, applying a high voltage of 1V~2V to the word line to turn on the MOS transistor, and then applying a high voltage of 5V~7V to the bit line to induce a floating effect of the MOS transistor, so that the unipolar type RRAM reaches a program voltage to perform the program operation; and
   when performing an erase operation, applying a high voltage level of 2V~3V to the word line to turn on the MOS transistor, and applying a high voltage level of 4V~6V to the bit line to induce a floating body effect of the MOS transistor, so that the unipolar type RRAM reaches an erase voltage to perform the erase operation.

2. The program and erase method according to claim 1, wherein a silicon film over the SOI substrate has a thickness of 200nm~500nm.

3. The program and erase method according to claim 1, wherein an insulator layer over the SOI substrate has a thickness of 800nm~1μm.

4. The program and erase method according to claim 1, wherein an insulator layer over the SOI substrate is formed of silicon oxide.

5. The program and erase method according to claim 1, wherein the MOS transistor comprises the source terminal, the drain terminal, a gate dielectric layer and the gate; the unipolar type RRAM comprises an upper metal layer, a lower metal layer and a resistive material layer interposed between the upper metal layer and the lower metal layer; and the unipolar type RRAM is on the MOS transistor with an isolation layer interposed between the unipolar type RRAM and the MOS transistor, and the isolation layer has a metal via hole which electrically connects the drain terminal of the MOS transistor and the lower metal layer of the unipolar type RRAM.

6. The program and erase method according to claim 5, wherein the isolation layer interposed between the MOS transistor and the unipolar type RRAM is a silicon oxide layer.

7. The program and erase method according to claim 5, wherein the resistive material layer of the unipolar type RRAM is formed of nickel oxide, zirconium oxide, or silicon oxide doped with copper.

8. The program and erase method according to claim 5, wherein the upper metal layer and lower metal layer of the unipolar type RRAM are formed of platinum, gold, or copper.

9. The program and erase method according to claim 2, wherein an insulator layer over the SOI substrate is formed of silicon oxide.

10. The program and erase method according to claim 2, wherein the MOS transistor comprises the source terminal, the drain terminal, a gate dielectric layer and the gate; the unipolar type RRAM comprises an upper metal layer, a lower metal layer and a resistive material layer interposed between the upper metal layer and the lower metal layer; and the unipolar type RRAM is on the MOS transistor with an isolation layer interposed between the unipolar type RRAM and the MOS transistor, and the isolation layer has a metal via hole which electrically connects the drain terminal of the MOS transistor and the lower metal layer of the unipolar type RRAM.

11. The program and erase method according to claim 10, wherein the isolation layer interposed between the MOS transistor and the unipolar type RRAM is a silicon oxide layer.

12. The program and erase method according to claim 10, wherein the resistive material layer of the unipolar type RRAM is formed of nickel oxide, zirconium oxide, or silicon oxide doped with copper.

13. The program and erase method according to claim 10, wherein the upper metal layer and lower metal layer of the unipolar type RRAM are formed of platinum, gold, or copper.

14. The program and erase method according to claim 3, wherein an insulator layer over the SOI substrate is formed of silicon oxide.

15. The program and erase method according to claim 3, wherein the MOS transistor comprises the source terminal, the drain terminal, a gate dielectric layer and the gate; the unipolar type RRAM comprises an upper metal layer, a lower metal layer and a resistive material layer interposed between the upper metal layer and the lower metal layer; and the unipolar type RRAM is on the MOS transistor with an isolation layer interposed between the unipolar type RRAM and the MOS transistor, and the isolation layer has a metal via hole which electrically connects the drain terminal of the MOS transistor and the lower metal layer of the unipolar type RRAM.

16. The program and erase method according to claim 15, wherein the isolation layer interposed between the MOS transistor and the unipolar type RRAM is a silicon oxide layer.

17. The program and erase method according to claim 15, wherein the resistive material layer of the unipolar type RRAM is formed of nickel oxide, zirconium oxide, or silicon oxide doped with copper.

18. The program and erase method according to claim 15, wherein the upper metal layer and lower metal layer of the unipolar type RRAM are formed of platinum, gold, or copper.

* * * * *